(12) United States Patent
Wang et al.

(10) Patent No.: US 12,091,740 B2
(45) Date of Patent: Sep. 17, 2024

(54) MASK SHEET AND METHOD OF MANUFACTURING THE SAME, OPENING MASK AND METHOD OF USING THE SAME, THIN FILM DEPOSITION DEVICE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ge Wang, Beijing (CN); Zhiliang Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 426 days.

(21) Appl. No.: 17/271,374

(22) PCT Filed: Jul. 24, 2020

(86) PCT No.: PCT/CN2020/104531
§ 371 (c)(1),
(2) Date: Feb. 25, 2021

(87) PCT Pub. No.: WO2021/013252
PCT Pub. Date: Jan. 28, 2021

(65) Prior Publication Data
US 2021/0246548 A1 Aug. 12, 2021

(30) Foreign Application Priority Data

Jul. 24, 2019 (CN) .......................... 201910671434.7

(51) Int. Cl.
*C23C 16/04* (2006.01)
*C23C 14/04* (2006.01)
(Continued)

(52) U.S. Cl.
CPC .......... *C23C 14/042* (2013.01); *C23C 16/042* (2013.01); *H10K 71/166* (2023.02)

(58) Field of Classification Search
CPC ....... C23C 14/04; C23C 14/042; C23C 16/04; C23C 16/042; C23C 8/04; C23C 10/04;
(Continued)

(56) References Cited

U.S. PATENT DOCUMENTS 9,192,959 B2 * 11/2015 Hong .................. C23F 1/02
2010/0206222 A1 * 8/2010 Sung .................. C23C 16/042
118/69

(Continued)

FOREIGN PATENT DOCUMENTS

CN 104561896 4/2015
CN 204803392 11/2015
(Continued)

OTHER PUBLICATIONS

PCT International Search Report (w/ English translation) for corresponding PCT Application No. PCT/CN2020/104531, mailed on Oct. 19, 2020, 5 pages.
(Continued)

*Primary Examiner* — Aiden Lee
(74) *Attorney, Agent, or Firm* — Dority & Manning, P.A.

(57) ABSTRACT

A mask sheet has a first side face and a second side face that are substantially parallel to each other and arranged oppositely. The first side face is perpendicular to a thickness direction of the mask sheet. The mask sheet includes: at least one opening portion, each opening portion including a first opening extending from the first side face toward the second
(Continued)

side face and a second opening extending from the second side face toward the first side face, and the first opening and the second opening are communicated with each other, and an inner border of the second opening being located within an outer border of the first opening in a direction perpendicular to a circumferential direction of the second opening; at least one groove located on a periphery of the second opening, the at least one groove being formed in the second side face of the mask sheet.

15 Claims, 13 Drawing Sheets

(51) Int. Cl.
*G03F 1/80* (2012.01)
*H10K 71/16* (2023.01)
(58) Field of Classification Search
CPC .... C23C 14/044; C23C 18/06; H10K 71/166; C30B 25/04
See application file for complete search history.

(56) References Cited

U.S. PATENT DOCUMENTS

| | | | |
|---|---|---|---|
| 2014/0225321 A1 | 8/2014 | Roh | |
| 2015/0007768 A1* | 1/2015 | Lee | B05C 21/005 |
| | | | 118/504 |
| 2015/0165464 A1* | 6/2015 | Baek | B05C 21/005 |
| | | | 118/504 |
| 2016/0126507 A1* | 5/2016 | Ko | C23C 14/042 |
| | | | 438/34 |
| 2018/0355468 A1 | 12/2018 | Wang et al. | |
| 2019/0203338 A1* | 7/2019 | Kawasaki | H10K 50/11 |
| 2021/0355572 A1* | 11/2021 | Li | C23C 14/042 |
| 2022/0056573 A1* | 2/2022 | Li | C23C 14/12 |
| 2022/0165951 A1* | 5/2022 | Seo | C23C 14/042 |

FOREIGN PATENT DOCUMENTS

| | | |
|---|---|---|
| CN | 105803389 | 7/2016 |
| CN | 108385083 | 8/2018 |
| CN | 108546914 | 9/2018 |
| CN | 108796435 | 11/2018 |
| CN | 208266253 | 12/2018 |
| CN | 110331377 | 10/2019 |
| EP | 3439066 | 2/2019 |
| EP | 3623495 | 3/2020 |
| WO | WO2018174508 | 9/2018 |

OTHER PUBLICATIONS

Chinese First Office Action (w/ English translation) for corresponding CN Application No. 201910671434.7, 22 pages.

* cited by examiner

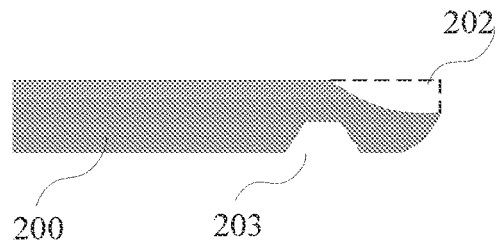
FIG. 9E
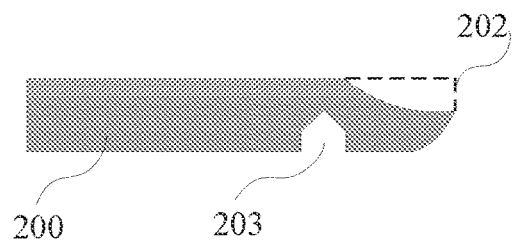
FIG. 9F
| At least one opening portion is formed by etching from a first side face of a mask sheet substrate in a thickness direction of the mask sheet substrate. | S10 |
↓
| At least one groove on a periphery of the second opening is formed in the second side face of the mask sheet substrate in the thickness direction of the mask sheet substrate. | S11 |
FIG. 10

MASK SHEET AND METHOD OF MANUFACTURING THE SAME, OPENING MASK AND METHOD OF USING THE SAME, THIN FILM DEPOSITION DEVICE AND DISPLAY APPARATUS

CROSS-REFERENCE TO RELATED APPLICATIONS

This application is a national phase entry under 35 USC 371 of International Patent Application No. PCT/CN 2020/104531 filed on Jul. 24, 2020, which claims priority to Chinese Patent Application No. 201910671434.7, filed on Jul. 24, 2019, which are incorporated herein by reference in their entirety.

TECHNICAL FIELD

The present disclosure relates to the technical field of masks, and in particular, to a mask sheet and a method of manufacturing the same, an opening mask and a method of using the same, a thin film deposition device and a display apparatus.

BACKGROUND

Organic light-emitting diode (OLED) display panels independently emit light through light-emitting functional layers to display images. Since backlight is needless, the OLED display panels have a faster response time, and have characteristics of large visual angle, high contrast, light weight, low power consumption, and flexibility that is easy to realize, etc. Thus, the OLED display panels are considered to be the most promising display devices at present.

SUMMARY

In one aspect, a mask sheet is provided. The mask sheet has a first side face and a second side face that are substantially parallel to each other and arranged oppositely. The first side face is perpendicular to a thickness direction of the mask sheet. The mask sheet includes at least one opening portion and at least one groove located on a periphery of a second opening. Each of the at least one opening portion includes a first opening extending from the first side face toward the second side face and the second opening extending from the second side face toward the first side face, and the first opening and the second opening are communicated with each other. An inner border of the second opening is located within an outer border of the first opening in a direction perpendicular to a circumferential direction of the second opening. The at least one groove is formed in the second side face of the mask sheet.

In some embodiments, the at least one opening portion includes a plurality of opening portions distributed at intervals.

In some embodiments, an orthographic projection of the at least one groove on the first side face is partially overlapped, or is non-overlapped with an orthographic projection of the first opening on the first side face.

In some embodiments, each groove is continuously arranged in the circumferential direction of the second opening.

In some embodiments, the at least one groove includes a plurality of grooves that are sequentially distributed in the direction perpendicular to the circumferential direction. Any two adjacent grooves of the plurality of grooves are connected or distributed at an interval.

In some embodiments, the at least one groove includes a plurality of grooves. The plurality of grooves are divided into at least one groove group. Each groove group includes at least two grooves, and grooves in a same groove group are arranged at intervals in the circumferential direction of the second opening.

In some embodiments, the at least one groove group includes a plurality of groove groups, and the plurality of groove groups are sequentially distributed in the direction perpendicular to the circumferential direction. Any two adjacent groove groups of the plurality of groove groups are connected or distributed at an interval.

In some embodiments, an orthographic projection of a groove of the at least one groove closest to the second opening on the first side face is partially overlapped, or is non-overlapped with the orthographic projection of the first opening on the first side face.

In some embodiments, a depth of each groove is less than or equal to a half of a thickness of the mask sheet.

In some embodiments, a longitudinal sectional shape of each groove in a width direction of the groove is at least one of an arch, a semicircle, a semiellipse, a polygon and a regular shape. The regular shape is a shape formed by combining at least two of the arch, the semicircle, the semiellipse and the polygon.

In some embodiments, the at least one opening portion includes a plurality of opening portions, and a minimum distance between a groove corresponding to each opening portion and a second opening of the opening portion is not completely equal.

In some embodiments, a minimum distance between a groove of the at least one groove closest to the second opening and the second opening is in a range from 100 μm to 2000 μm.

In another aspect, an opening mask is provided. The opening mask includes a frame and the mask sheet as described in any of the above embodiments that is fixed on the frame.

In some embodiments, the frame and the mask sheet are made of a same material.

In yet another aspect, a thin film deposition device is provided. The thin film deposition device includes a chamber, and a carrier, a mask fixing component, and an opening mask that are provided in the chamber. The carrier is used to carry a substrate to be subject to thin film deposition. The mask fixing component is used to fix the opening mask. The opening mask is the opening mask described above.

In yet another aspect, a method of manufacturing a mask sheet is provided. The method includes: forming at least one opening portion by etching from a first side face of a mask sheet substrate in a thickness direction of the mask sheet substrate, each opening portion including a first opening extending from the first side face toward a second side face of the mask sheet substrate and a second opening extending from the second side face toward the first side face, and the first opening and the second opening being communicated with each other, and an inner border of the second opening being located within an outer border of the first opening in a direction perpendicular to a circumferential direction of the second opening, the first side face and the second side face being substantially parallel to each other and arranged oppositely, and the first side face being perpendicular to the thickness direction of the mask sheet substrate; and forming at least one groove on a periphery of the second opening in the second side face of the mask sheet substrate.

In yet another aspect, a method of using the opening mask as described above is provided. The method includes: placing the opening mask on a side of a substrate; and depositing a thin film material onto the substrate from the side of the substrate provided with the opening mask, the thin film material deposited onto the substrate through an opening portion of the opening mask forming a corresponding thin film.

In yet another aspect, a display apparatus is provided. The display apparatus includes a base and a thin film disposed on the base, and the thin film is formed through the method of using the opening mask described above.

BRIEF DESCRIPTION OF THE DRAWINGS

In order to describe technical solutions in the present disclosure more clearly, the accompanying drawings to be used in some embodiments of the present disclosure will be introduced below briefly. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but not limitations on an actual size of a product, an actual process of a method and an actual timing of a signal to which the embodiments of the present disclosure relate.

FIG. 9E is yet another longitudinal sectional structural view of at least one groove, in accordance with some embodiments of the present disclosure;

FIG. 9F is yet another longitudinal sectional structural view of at least one groove, in accordance with some embodiments of the present disclosure;

FIG. 10 is a flow diagram of a method of manufacturing a mask sheet, in accordance with some embodiments of the present disclosure;

DETAILED DESCRIPTION

Figure 1A:
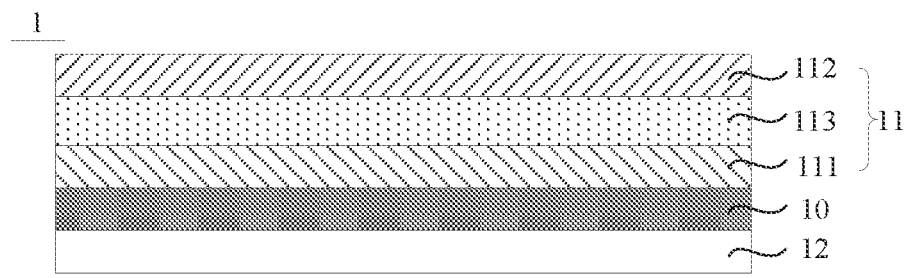
FIG. 1A is a longitudinal sectional structural view of an OLED display panel, in accordance with some embodiments of the present disclosure.

Technical solutions in some embodiments of the present disclosure will be described clearly and completely with reference to the drawings below. Obviously, the described embodiments are merely some but not all embodiments of the present disclosure. All other embodiments obtained by a person of ordinary skill in the art on a basis of the embodiments of the present disclosure shall be included in the protection scope of the present disclosure Unless the context requires otherwise, the term "comprise" and other forms thereof such as the third-person singular form "comprises" and the present participle form "comprising" throughout the description and the claims are construed as an open and inclusive meaning, i.e., "including, but not limited to". In the description of the specification, terms such as "one embodiment", "some embodiments", "exemplary embodiments", "an example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

Terms such as "first" and "second" are only used for descriptive purposes, and are not to be construed as indicating or implying the relative importance or implicitly indicating the number of indicated technical features below. Thus, a feature defined by "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and their extensions may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phase "at least one of A, B and C" has the same meaning as the phase "at least one of A, B or C", and both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of "applicable to" or "configured to" herein means an open and inclusive expression, which does not exclude devices that are applicable to or configured to perform additional tasks or steps.

The term "about", "approximately" or "substantially" as used herein includes a stated value and an average value within an acceptable range of deviation of a particular value. The acceptable range of deviation is determined by a person of ordinary skill in the art in view of the measurement in question and the error associated with a particular amount of measurement (i.e., the limitations of the measurement system).

Exemplary embodiments are described herein with reference to sectional views and/or plan views as idealized exemplary figures. In the accompanying drawings, thicknesses of layers and areas are enlarged for clarity. Thus, variations in shapes relative to the accompanying drawings due to, for example, manufacturing techniques and/or tolerances may be envisaged. Therefore, exemplary embodiments should not be construed to be limited to the shapes of areas shown herein, but include deviations in shapes due to, for example, manufacturing. For example, an etched area shown in a rectangular shape generally has a curved feature. Therefore, areas shown in the accompanying drawings are schematic in nature and their shapes are not intended to show actual shapes of the areas in a device and are not intended to limit the scope of the exemplary embodiments.

Some embodiments of the present disclosure provide a display apparatus. The display apparatus may be a product or a component, and the component may be a display panel, a display substrate, or the like. For example, the display apparatus may be a self-luminous display apparatus, such as an organic light-emitting diode (OLED) display apparatus, a quantum dot light-emitting diode (QLED) display apparatus. In this case, the display apparatus may further include components such as a flexible printed circuit (FPC) bonded to a display panel. The display apparatus may be any product or component having a display function such as a display, a television, a digital camera, a mobile phone, a tablet computer.

As shown in FIG. 1A, for example, the display apparatus is an OLED display panel 1, and the OLED display panel 1 has an active area (AA) and a peripheral area located outside the active area. The active area includes a plurality of sub-pixels. The OLED display panel 1 includes a base 12, a light-emitting device 10 provided in each sub-pixel on the base 12, and an encapsulation layer 11 covering at least the active area. The encapsulation layer 11 includes a first inorganic layer 111, a second inorganic layer 112 and an organic layer 113. The encapsulation layer 11 may extend to the peripheral area.

In some embodiments, the base 12 may include, for example, a glass base or a polyimide (PI) base. The base 12 may further include a buffer layer and other film layers on the glass base or the PI base.

Figure 1B:
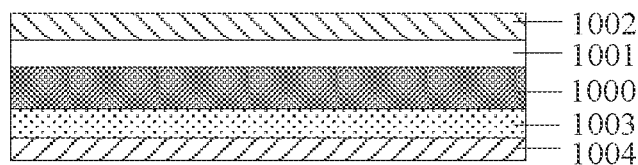
FIG. 1B is a structural diagram of a light-emitting functional layer, in accordance with some embodiments of the present disclosure.

The light-emitting device 10 is configured to emit light by itself, and as shown in FIG. 1B, the light-emitting device 10 includes an anode, a light-emitting functional layer 100 and a cathode. In some embodiments, the light-emitting functional layer 100 may only include an emission layer (EL) 1000. In some other embodiments, as shown in FIG. 1B, the light-emitting functional layer 100 may further include one or more of an electron transporting layer (ETL) 1001, an electron injection layer (EIL) 1002, a hole transporting layer (HTL) 1003 and a hole injection layer (HIL) 1004 in addition to the emission layer 1000. For example, the light-emitting functional layer 100 may include the electron injection layer 1002, the electron transporting layer 1001, the emission layer 1000, the hole transporting layer 1003 and the hole injection layer 1004 that are sequentially arranged.

It will be noted that the light-emitting functional layer 100 is not limited to only including a combination of the emission layer 1000, the electron transporting layer 1001, the electron injection layer 1002, the hole transporting layer 1003 and the hole injection layer 1004, and the light-emitting functional layer 100 may further include other functional layers.

It will be noted that other film layers may be provided between the light-emitting functional layer 100 and the base 12, and the other film layers may be provided according to conventional techniques in the art, which is not limited in the embodiments of the present disclosure. For example, a pixel driving circuit may be provided between the base 12 and the light-emitting functional layer 100.

In the embodiments of the present disclosure, materials of the first inorganic layer 111, the second inorganic layer 112 and the organic layer 113 are not limited. For example, the material of the first inorganic layer 111 may be silicon oxynitride, the material of the second inorganic layer 112 may be silicon nitride, silicon oxynitride, a mixture of silicon nitride and silicon oxynitride, and the material of the organic layer 113 may be polymethyl methacrylate (PMMA). Since silicon oxynitride has a good hydrophilicity, it may be better fused with the organic layer 113, and especially when the organic layer 113 is prepared on a side of the first inorganic layer 111 away from the light-emitting functional layer 100, the first inorganic layer 111 made of silicon oxynitride may make the organic layer 113 easier to form and smoother.

In the embodiments of the present disclosure, preparation processes of the first inorganic layer 111, the second inorganic layer 112 and the organic layer 113 are not limited. For example, the first inorganic layer 111 and the second inorganic layer 112 may be prepared by a plasma enhanced chemical vapor deposition (PECVD) process. The organic layer 113 may be prepared by an ink jet printing (IJP) process.

It will be understood by those skilled in the art that, the OLED display panel 1 is taken as an example, the OLED display panel 1 is not manufactured individually, but an OLED mother board is first manufactured, and finally the OLED mother board is cut into individual OLED display panels 1. Based on this, when the first inorganic layer 111 and the second inorganic layer 112 are prepared on the OLED mother board using the PECVD process, a plurality of openings in an opening mask are aligned with areas where the OLED display panels 1 are to be formed on a mother board base (which can be referred to as a substrate), so that an inorganic material is deposited on the mother board base through the openings, and the first inorganic layer 111 and the second inorganic layer 112 are formed in the areas where the OLED display panels 1 are to be formed on the mother board base, thereby obtaining the OLED mother board including a plurality of OLED display panels 1.

It will be noted that the foregoing describes the use of the opening mask only by taking the first inorganic layer 111 and the second inorganic layer 112 as an example, but in the embodiments of the present disclosure, it is not limited to forming the first inorganic layer 111 and the second inorganic layer 112 using the opening mask. For other film layers in the OLED display panel 1, or film layers in other types of display panels, as long as the film layers may be prepared using an opening mask, an opening mask according to the embodiments of the present disclosure is applicable.

Figure 2:
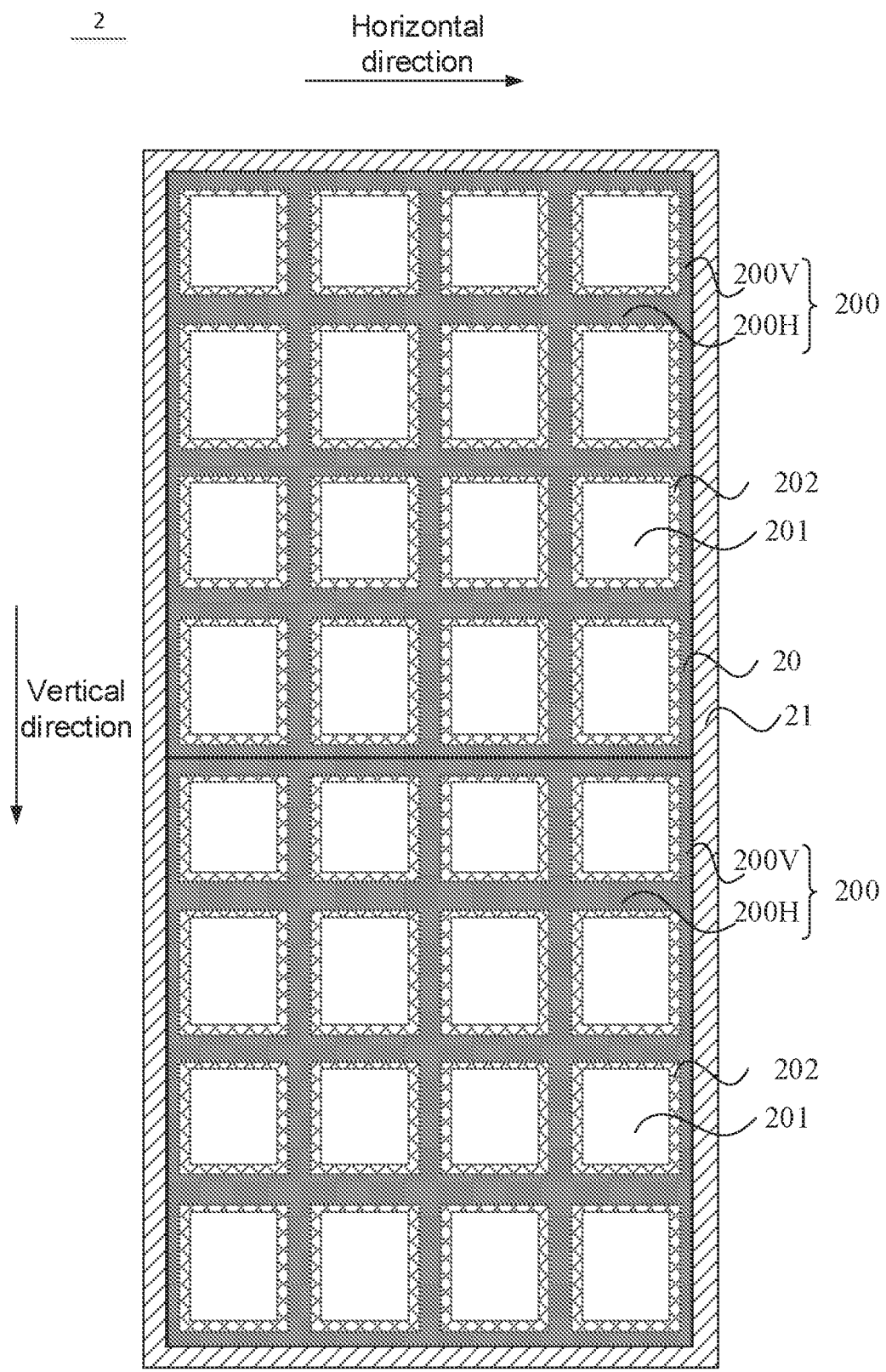
FIG. 2 is a structural diagram of a mask, in accordance with some embodiments of the present disclosure.

Some embodiments of the present disclosure provide an opening mask 2. As shown in FIG. 2, the opening mask 2 includes a frame 21 and a plurality of mask sheets 20 fixed on the frame 21. The plurality of mask sheets 20 may be arranged in a horizontal direction or a vertical direction. For example, as shown in FIG. 2, two mask sheets 20 are arranged on the frame 21 in the vertical direction.

In some embodiments, materials for manufacturing the frame 21 and the mask sheet 20 may be the same or different. For example, the frame 21 and the mask sheet 20 may be made of a metal material, and the metal material may be a simple metal or an alloy. For another example, the materials for manufacturing the frame 21 and the mask sheet 20 may be an invar (i.e., a nickel-iron alloy).

As shown in FIG. 2, after the mask sheets 20 are manufactured, the mask sheets 20 are stretched, and then the mask sheets 20 and the frame 21 are welded together by a laser welding technology to form the opening mask 2. In a process of manufacturing the mask sheet 20, opening portions 201 in the mask sheet 20 are formed after forming a plurality of isolation strips 200 by wet etching a mask sheet substrate.

Figure 4A:
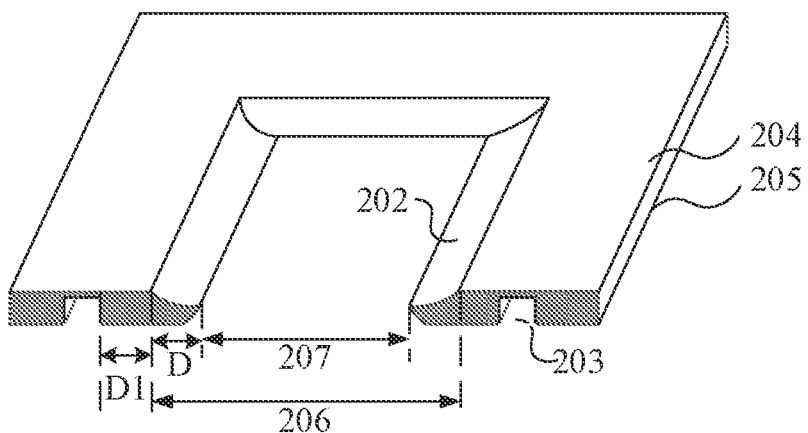
FIG. 4A is a three-dimensional structural diagram taken along the B-B line in FIG. 3A, in accordance with some embodiments of the present disclosure.
Figure 4B:
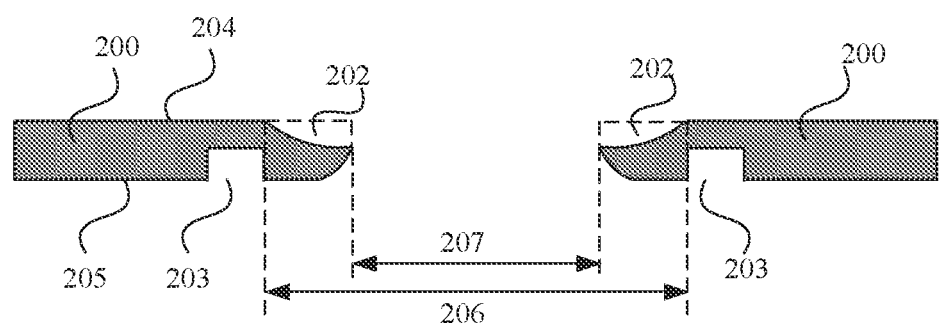
FIG. 4B is a cross-sectional view taken along the B-B line in FIG. 3A, in accordance with some embodiments of the present disclosure.
Figure 4C:
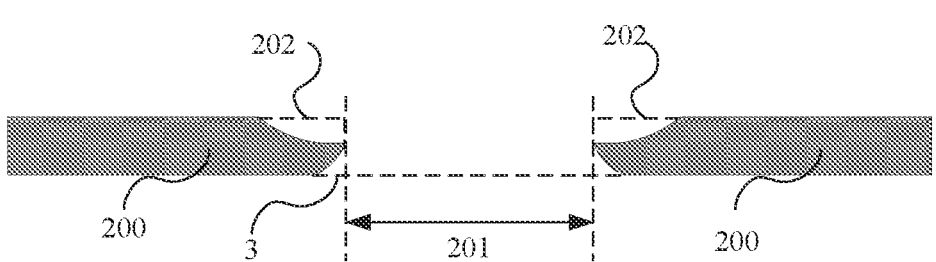
FIG. 4C is a cross-sectional view of a mask sheet before being stretched.
Figure 4D:
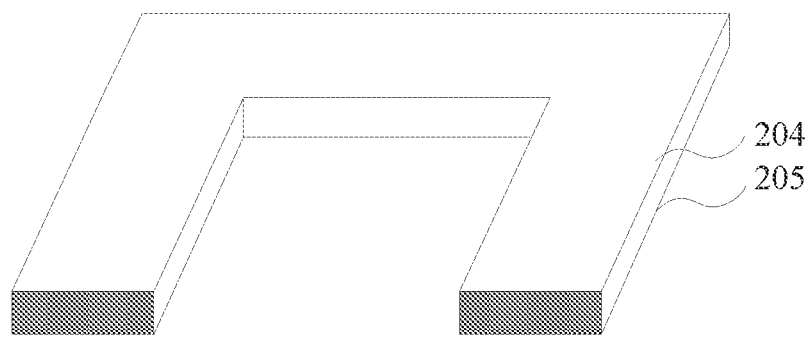
FIG. 4D is a three-dimensional structural diagram of an opening portion of a mask sheet and edges of the opening portion under ideal conditions.
Figure 4E:
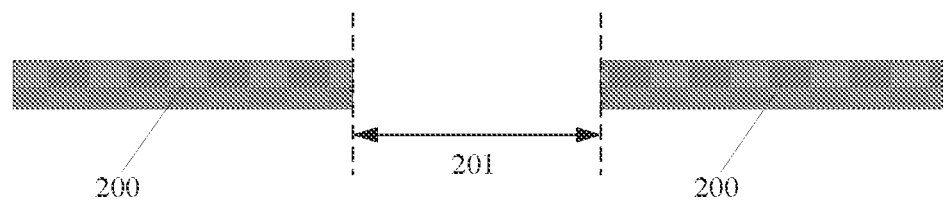
FIG. 4E is a cross-sectional view of an opening portion of a mask sheet and edges of the opening portion under ideal conditions.

However, due to etching characteristics of a wet etching solution, cross-sections of the isolation strips 200 enclosed to form the opening portion 201 are not flat. Thus, a circle of recessed portion 202 or part of the circle of recessed portion 202 is generally formed in a circumferential direction of the opening portion 201, as shown in FIGS. 4A, 4B and 4C. And in an ideal state, the cross-sections of the isolation strips 200 enclosed to form edges of the opening portion 201 are flat, as shown in FIGS. 4D and 4E.

Figure 5A:
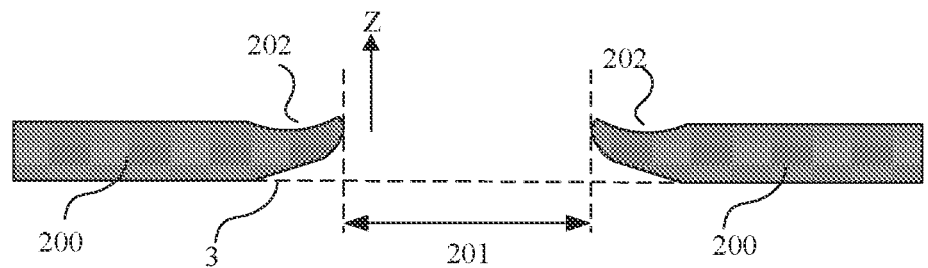
FIG. 5A is a cross-sectional view of a mask sheet after the mask sheet is stretched and a recessed portion is deformed.
Figure 5B:
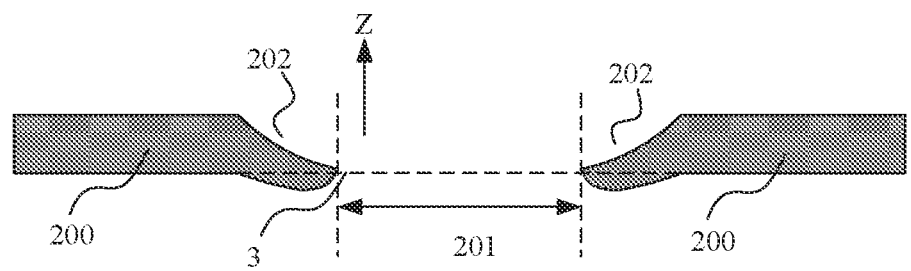
FIG. 5B is a cross-sectional view of another mask sheet after the mask sheet is stretched and a recessed portion is deformed.

Referring to FIG. 4C, due to the existence of the recessed portion 202, when the mask sheet 20 is subsequently stretched, since thicknesses of the area where the recessed portion 202 is located are less than thicknesses of other unetched areas of the isolation strips 200, the recessed portion 202 may be deformed under an influence of a pulling force, which may further cause serious deformations of the sides of the isolation strips 200 adjacent to the opening portion 201. The deformations are mainly generated in a Z-axis direction, for example, a phenomenon of warping upwards relative to a horizontal plane 3 (as shown in FIG. 5A) or bending downwards relative to the horizontal plane 3 (as shown in FIG. 5B) may be generated, thereby resulting in a poor film layer deposition effect of the opening mask 2 caused by an offset of a film layer deposited using the opening mask 2 relative to a predetermined area and a shadow with a large width that is formed near the film layer.

Therefore, in order to improve the poor film layer deposition effect of the opening mask 2 caused by the offset of the film layer deposited using the opening mask 2 including the mask sheets 20 shown in FIG. 4C and the wide shadow, some embodiments of the present disclosure provide a mask sheet 20. As shown in FIG. 4A, at least one (one or more) groove 203 is provided in a side face of the mask sheet 20 opposite to a side face where the recessed portion 202 is formed, i.e., in a second side face 205. The at least one groove 203 may balance the pulling force borne by a first side face 204 where the recessed portion 202 on the isolation strips 200 is located, so that the pulling force borne by the side face where the recessed portion 202 on the isolation strips 200 is located and the pulling force borne by the side face where the groove(s) 203 are located are relatively balanced. Therefore, it may be ensured that the sides of the isolation strips 200 where the recessed portion 202 is located are not substantially deformed in the Z-axis direction, so that the film layer deposited using the opening mask 2 including the mask sheets 20 is not offset, the formed shadow is narrow, and the film layer deposition effect is good.

Figure 3A:
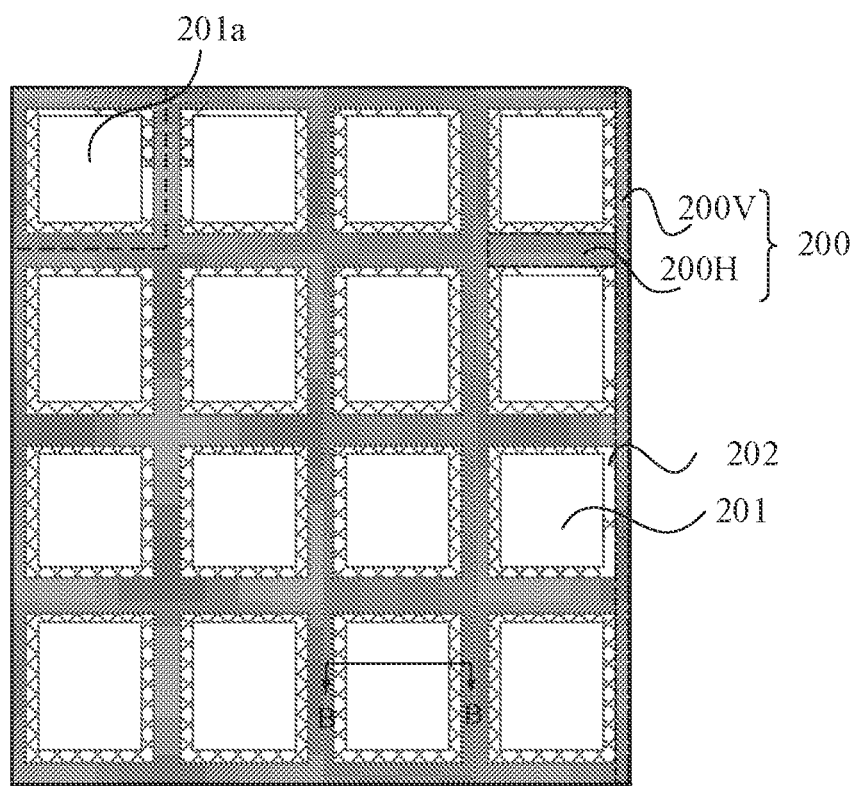
FIG. 3A is a structural diagram of a mask sheet, in accordance with some embodiments of the present disclosure.
Figure 3B:
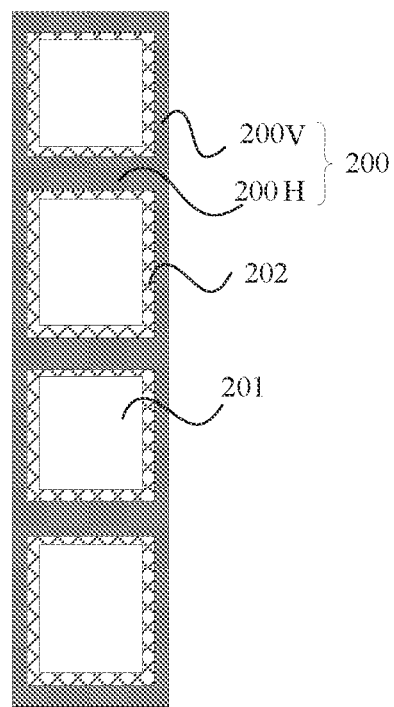
FIG. 3B is a structural diagram of another mask sheet, in accordance with some embodiments of the present disclosure.
Figure 4F:
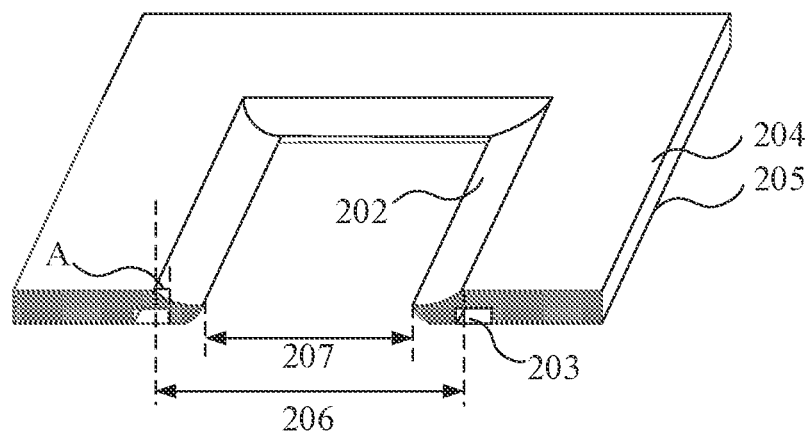
FIG. 4F is a three-dimensional structural diagram taken along the B-B line in FIG. 3A, in accordance with some embodiments of the present disclosure.

In some embodiments, as shown in FIGS. 3A, 3B, 4A and 4B, the mask sheet 20 has the first side face 204 and the second side face 205 that are substantially parallel to each other and arranged oppositely, and the first side face 204 and the second side face 205 are perpendicular to a thickness direction of the mask sheet 20. As shown in FIGS. 4A, 4B, and 4F, the mask sheet 20 includes at least one opening portion 201, and each opening portion 201 includes a first opening 206 extending from the first side face 204 toward the second side face 205 and a second opening 207 extending from the second side face 205 toward the first side face 204, and the first opening 206 and the second opening 207 are communicated with each other. An orthographic projection of the second opening on a surface parallel to the first side face 204 is located within an orthographic projection of the first opening 206 on the surface.

It will be noted that the orthographic projection of the second opening 207 on the surface refers to a projection of the second opening 207 on the surface in the thickness direction of the mask sheet 20. The orthographic projection of the second opening 207 on the surface being located within the orthographic projection of the first opening 206 may be that an inner border of the orthographic projection of the second opening 207 on the surface and an outer border of the orthographic projection of the first opening 206 on the surface have a certain distance D therebetween.

As shown in FIGS. 4A and 4B, at least one (one or more) groove 203 is provided on a periphery of the second opening 207. The at least one groove 203 is formed in the second side face 205 of the mask sheet 20 and recessed towards the first side face 204 of the mask sheet 20.

The periphery of the second opening 207 refers to the vicinity of the second opening 207. It will be understood by those skilled in the art that a plurality of opening portions 201 are generally provided in one mask sheet 20, and the periphery of the second opening 207 refers to a portion of the mask sheet 20 around the opening portion 201. For example, as shown in FIG. 3A, for the opening portion 201a, the periphery of the second opening 207 of the opening portion 201a is an area indicated by the dashed line in FIG. 3A. In some embodiments, as shown in FIGS. 3A and 3B, the at least one opening portion 201 includes a plurality of opening portions 201 distributed at intervals. Each mask sheet 20 includes a plurality of isolation strips 200. The isolation strips 200 include horizontal isolation strips 200H extending in the horizontal direction and vertical isolation strips 200V extending in the vertical direction. The plurality of isolation strips 200 are distributed in a grid shape to space out the plurality of opening portions 201. For example, as shown in FIG. 3A, twenty horizontal isolation strips 200H in the horizontal direction and five vertical isolation strips 200V in the vertical direction are distributed in a grid shape to form sixteen opening portions 201. For another example, as shown in FIG. 3B, five horizontal isolation strips 200H in the horizontal direction and two vertical isolation strips 200V in the vertical direction are distributed in a grid shape to form four opening portions 201

In some embodiments, as shown in FIGS. 4A and 4B, a recessed portion 202 is provided in a portion of the mask sheet 20 around each opening portion 201, and the recessed portion 202 is formed at a corner where the opening portion 201 and the first side face 204 intersect. The recessed portion can be regarded as the first opening.

As shown in FIGS. 4A and 4B, an orthographic projection of the at least one groove 203 on the first side face 204 is non-overlapped with an orthographic projection of the recessed portion 202 on the first side face 204. FIGS. 4A and 4B illustrate an example in which the at least one groove 203 includes one groove. As shown in FIG. 4A, a side of the groove proximate to the recessed portion 202 and a side of the recessed portion 202 proximate to the groove have a distance D1 therebetween in a direction perpendicular to the thickness of the mask sheet 20. As shown in FIG. 4F, the orthographic projection of the at least one groove 203 on the first side face 204 is partially overlapped with the orthographic projection of the recessed portion 202 on the first side face 204, and the overlapping portion is shown as A in FIG. 4F. In this way, the pulling force borne by the first side face where the recessed portion 202 on the isolation strips 200 is located may be balanced, so that the pulling force borne by the side face where the recessed portion 202 on the isolation strips 200 is located and the pulling force borne by the side face where the groove 203 is located are relatively balanced.

It will be noted that the orthographic projection of the at least one groove 203 on the first side face 204 refers to a projection of the at least one groove 203 on the first side face 204 in the thickness direction of the mask sheet 20. Similarly, the orthographic projection of the recessed portion 202 on the first side face 204 refers to a projection of the recessed portion 202 on the first side face 204 in the thickness direction of the mask sheet 20.

In some embodiments, each of the at least one groove 203 located on the periphery of the second opening 207 may be continuously arranged in a circumferential direction of the second opening 207. The groove 203 with this structure is simple in structure and convenient to be set, and in a case where a depth of the groove 203 is equal, the pulling force borne by the side face where the recessed portion 202 on the isolation strips 200 is located may be balanced to a greatest extent.

Figure 6A:
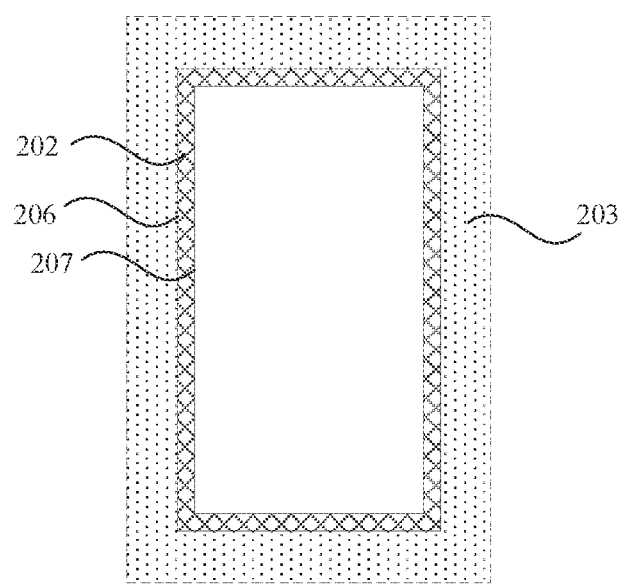
FIG. 6A is a structural diagram of at least one groove, in accordance with some embodiments of the present disclosure.

For example, as shown in FIG. 6A, in a case where only one groove 203 is provided on the periphery of the second opening 207, the groove 203 may be continuously arranged in the circumferential direction of the second opening 207. That is, the groove 203 is arranged continuously around the second opening 207. In some embodiments, the at least one groove located on the periphery of the second opening 207 may include a plurality of grooves, and the plurality of grooves may be sequentially distributed in a direction perpendicular to the circumferential direction. That is, the plurality of grooves are nested, and any two adjacent grooves of the plurality of grooves are connected or distributed at an interval.

Figure 6B:
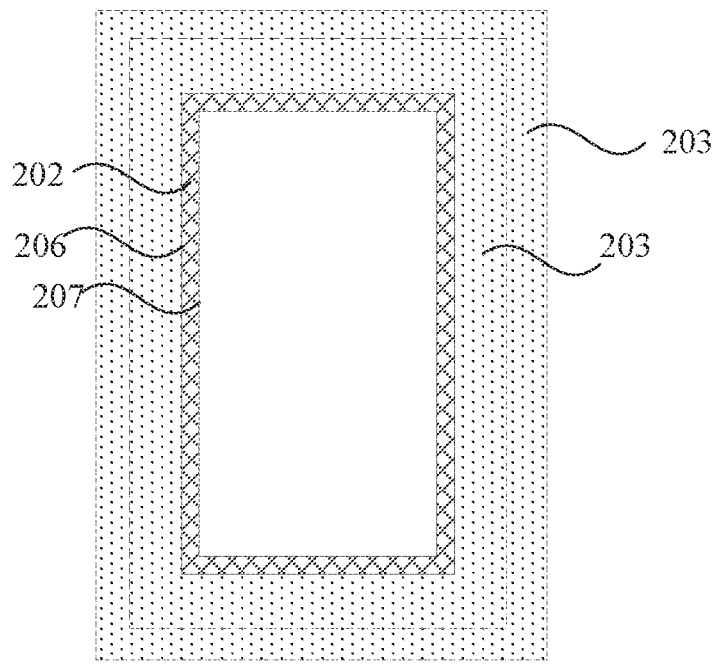
FIG. 6B is another structural diagram of at least one groove, in accordance with some embodiments of the present disclosure.
Figure 6C:
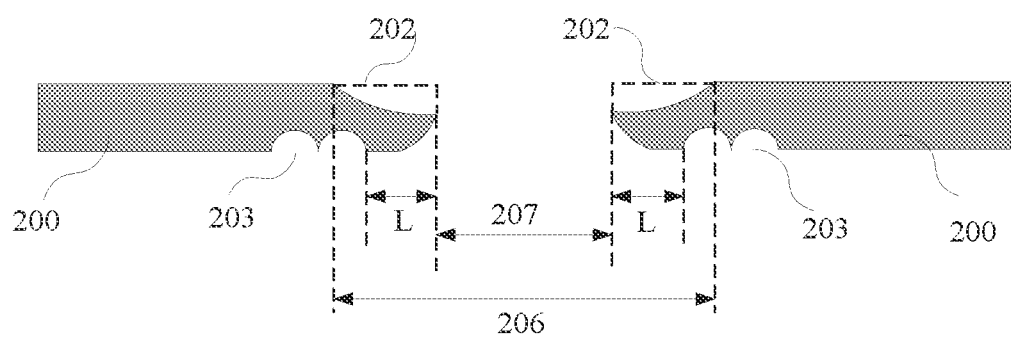
FIG. 6C is yet another cross-sectional view taken along the B-B line in FIG. 3A, in accordance with some embodiments of the present disclosure.

In some examples, as shown in FIG. 6B, two grooves 203 are provided on the periphery of the second opening 207, the two grooves 203 are nested in the direction perpendicular to the circumferential direction, and the two grooves are connected. As shown in FIG. 6C, the two grooves 203 with semicircular longitudinal sections are connected. In this way, in a case where the plurality of grooves 203 are connected, depths of the plurality of grooves 203 may be set to be small, so as to ensure strengths of the isolation strips 200.

Figure 6D:
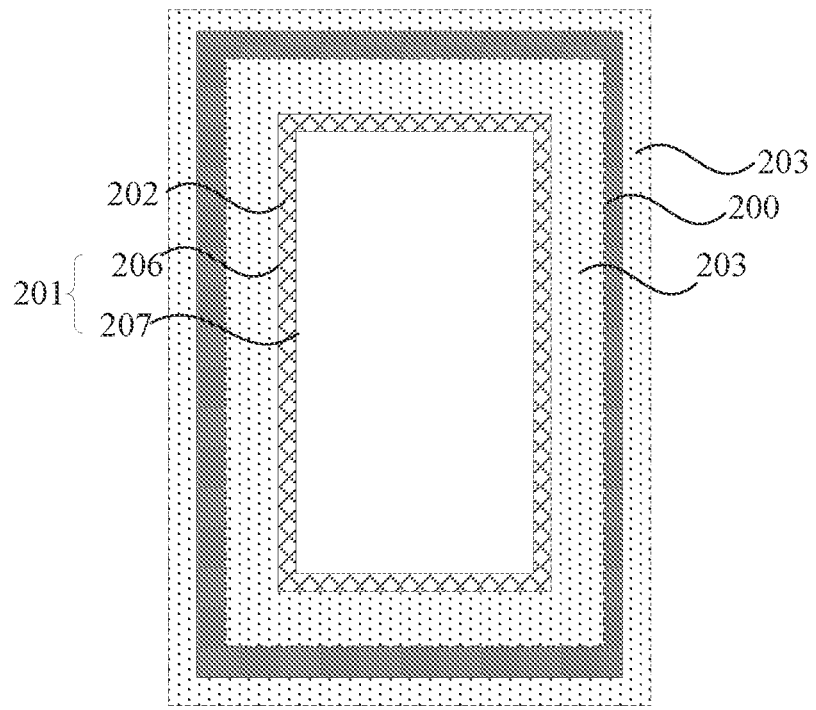
FIG. 6D is yet another structural diagram of at least one groove, in accordance with some embodiments of the present disclosure.
Figure 6E:
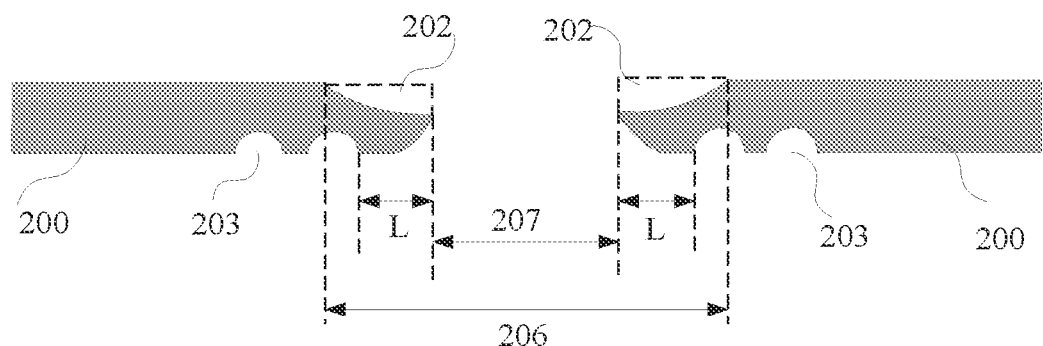
FIG. 6E is yet another cross-sectional view taken along the B-B line in FIG. 3A, in accordance with some embodiments of the present disclosure.

In some other examples, as shown in FIG. 6D, two grooves 203 are provided on the periphery of the second opening 207, the two grooves 203 are nested in the direction perpendicular to the circumferential direction, and the two grooves are distributed at an interval. As shown in FIG. 6E, the two grooves 203 with semicircular longitudinal sections are distributed at an interval.

Figure 7A:
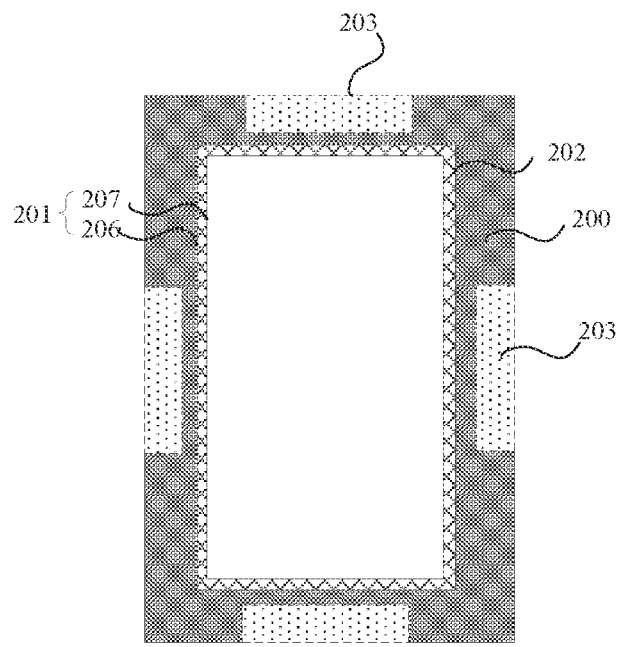
FIG. 7A is yet another structural diagram of at least one groove, in accordance with some embodiments of the present disclosure.
Figure 7B:
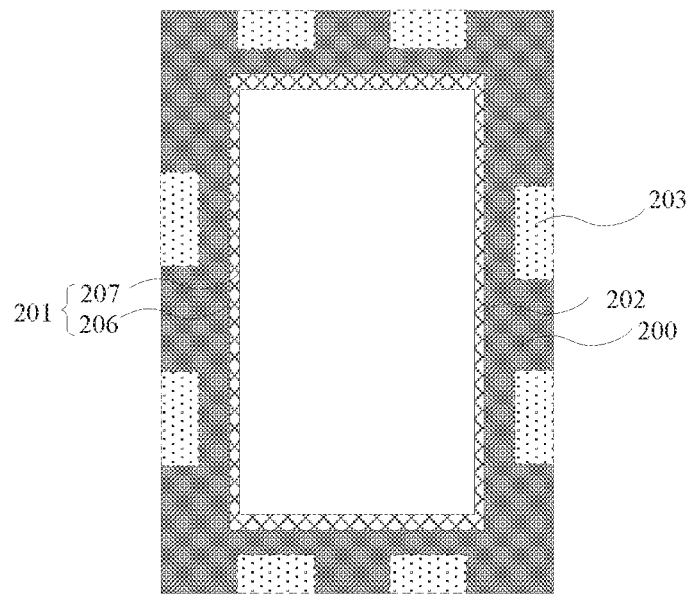
FIG. 7B is yet another structural diagram of at least one groove, in accordance with some embodiments of the present disclosure.

In the embodiments of the present disclosure, in a case where a plurality of grooves 203 are provided on the periphery of the second opening 207, the plurality of grooves 203 may better share the pulling force borne by the mask sheet 20 with the recessed portion 202, and it may be avoided that a depth of the recessed portion 202 is set to be too large. In some embodiments, as shown in FIGS. 7A and 7B, the at least one groove 203 located on the periphery of the second opening 207 includes a plurality of grooves. The plurality of grooves are divided into at least one groove group, and each groove group includes at least two grooves. Grooves in a same groove group are arranged at intervals in the circumferential direction of the second opening 207.

For example, as shown in FIG. 7A, the at least one groove located on the periphery of the second opening 207 includes four grooves, and the four grooves form a groove group. The four grooves in the groove group are arranged at intervals in the circumferential direction of the second opening 207.

For another example, as shown in FIG. 7B, the at least one groove located on the periphery of the second opening 207 includes eight grooves 203, and the eight grooves 203 form a groove group. The eight grooves in the groove group are arranged at intervals in the circumferential direction of the second opening 207.

In some embodiments, the at least one groove group located on the periphery of the second opening 207 includes a plurality of groove groups, and the plurality of groove groups are nested in the direction perpendicular to the circumferential direction. Any two adjacent groove groups of the plurality of groove groups are connected or distributed at an interval.

Figure 7C:
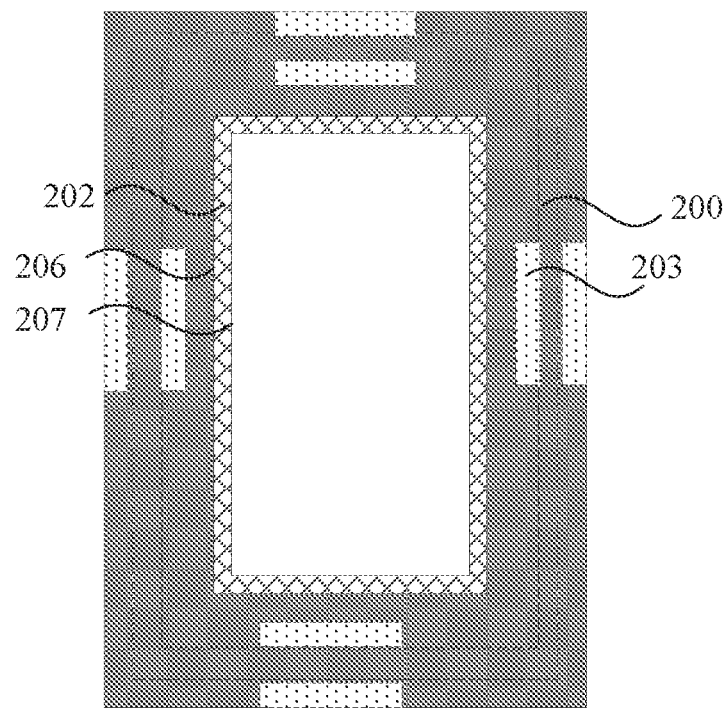
FIG. 7C is yet another structural diagram of at least one groove, in accordance with some embodiments of the present disclosure.

For example, as shown in FIG. 7C, the at least one groove group located on the periphery of the second opening 207 includes two groove groups, and the two groove groups are sequentially distributed in the direction perpendicular to the circumferential direction. That is, the two groove groups are nested, and any two adjacent groove groups of the two groove groups are distributed at an interval.

It will be noted that the shapes of grooves in different groove groups may be the same or different, which is not limited in the embodiments of the present disclosure. For example, as shown in FIG. 7C, the shapes of the grooves in the two groove groups located on the periphery of the second opening 207 are the same. Grooves in different groove groups may be aligned or not aligned in the direction perpendicular to the circumferential direction of the second opening, which is not limited in the embodiments of the present disclosure. For example, as shown in FIG. 7C, the grooves in the two groove groups located on the periphery of the second opening 207 are aligned in the direction perpendicular to the circumferential direction of the second opening.

In some embodiments, in the at least one groove located on the periphery of the second opening 207, an orthographic projection of a groove 203 closest to the second opening 207 on the first side face 204 is partially overlapped, or is non-overlapped with an orthographic projection of the first opening 206 on the first side face 204.

Figure 8:
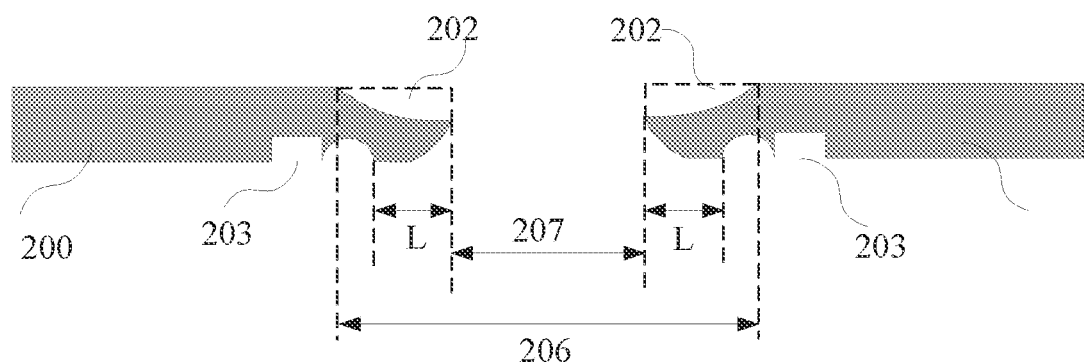
FIG. 8 is yet another cross-sectional view taken along the B-B line in FIG. 3A, in accordance with some embodiments of the present disclosure.

For example, as shown in FIGS. 6C, 6E and 8, the orthographic projection of the groove 203 closest to the second opening 207 on the first side face 204 is partially overlapped with the orthographic projection of the first opening 206 on the first side face 204.

In some embodiments, the depth of each of the at least one groove located on the periphery of the second opening 207 is less than or equal to a half of a thickness of the mask sheet 20. If the depth of the groove 203 is large, an area with a small thickness occurs in the mask sheet 20, which affects the strength of the mask sheet 20, and thus the depth of the groove 203 may be controlled within the half of the thickness of the mask sheet 20.

For example, the thickness of the mask sheet 20 is in a range from 100 μm to 200 μm, and the depth of the groove 203 may be in a range from 40 μm to 100 μm.

In some embodiments, the groove 203 may be formed by an etching (e.g., wet etching or dry etching). The wet etching is taken as an example, and an etching depth of the groove 203 may be controlled by controlling a concentration of a wet etching solution and an etching time, so that the etching depth is less than the half of the thickness of the mask sheet 20. Of course, the dry etching may also achieve similar effects. Therefore, the etching process may be referred to as a half-etching technique.

In some embodiments, a longitudinal sectional shape of each of the at least one groove located on the periphery of the second opening 207 in a width direction of the groove may be at least one of an arch, a semicircle, a semiellipse, a polygon and a regular shape. The regular shape may be a shape formed by combining at least two of the arch, the semicircle, the semiellipse and the polygon.

For example, the polygon may be a rectangle, a triangle, a trapezoid, and the rectangle may be a square.

As shown in FIGS. 4A and 4B, the longitudinal sectional shape of the groove 203 in the width direction of the groove is the rectangle.

Figure 9A:
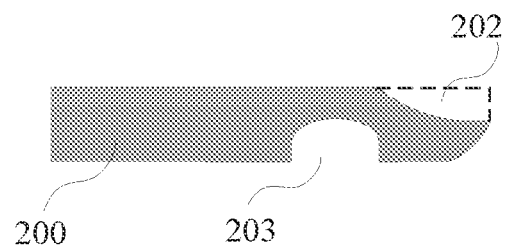
FIG. 9A is a longitudinal sectional structural view of at least one groove, in accordance with some embodiments of the present disclosure.

As shown in FIG. 9A, the longitudinal sectional shape of the groove 203 in the width direction of the groove is the arch.

Figure 9B:
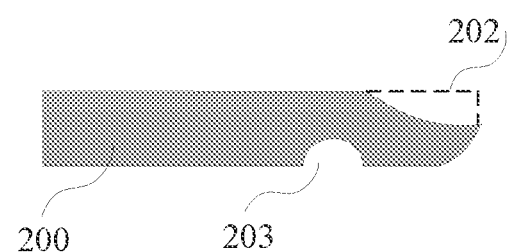
FIG. 9B is another longitudinal sectional structural view of at least one groove, in accordance with some embodiments of the present disclosure.

As shown in FIG. 9B, the longitudinal sectional shape of the groove 203 in the width direction of the groove is the semicircle. The semicircle refers to a portion of a circle, which may be a half, less than the half (e.g., ¼ circle), or more than the half (e.g., ¾ circle).

Figure 9C:
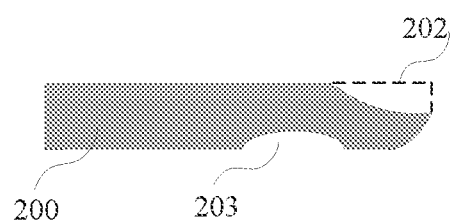
FIG. 9C is yet another longitudinal sectional structural view of at least one groove, in accordance with some embodiments of the present disclosure.

As shown in FIG. 9C, the longitudinal sectional shape of the groove 203 in the width direction of the groove is the semiellipse. The semiellipse refers to a portion of an ellipse, which may be a half, less than the half (e.g., ¼ ellipse), or more than the half (e.g., ¾ ellipse).

Figure 9D:
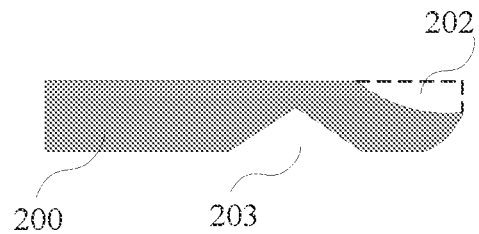
FIG. 9D is yet another longitudinal sectional structural view of at least one groove, in accordance with some embodiments of the present disclosure.

As shown in FIG. 9D, the longitudinal sectional shape of the groove 203 in the width direction of the groove is the triangle. It will be noted that the triangle may be a scalene triangle, an isosceles triangle, an equilateral triangle, a right triangle, etc.

As shown in FIG. 9E, the longitudinal sectional shape of the groove 203 in the width direction of the groove is the trapezoid.

As shown in FIG. 9F, the longitudinal sectional shape of the groove 203 in the width direction of the groove is the regular shape. The regular shape may be a shape formed by combining at least two of the polygon, the arch, the semicircle and the semiellipse. For example, as shown in FIG. 9F, the regular shape is formed by combining the triangle and the rectangle in the thickness direction of the mask sheet.

The longitudinal sectional shape of the groove 203 in the width direction of the groove is variable, and thus the longitudinal sectional shape of the groove 203 in the width direction of the groove may be flexibly selected according to the thickness of the mask sheet 20 and an actual condition of the pulling force borne by the mask sheet 20 during being stretched.

In some embodiments, the at least one opening portion included in the mask sheet 20 includes a plurality of opening portions. A distance between a groove 203 corresponding to each opening portion 201 and a second opening 207 of the opening portion 201 is not completely equal.

Since the recessed portions 202 formed by the etching are not necessarily equal in depth and width, specific positions of the grooves 203 may be selected according to a specific condition of a recessed portion 202 at each opening portion 201 when providing the grooves 203.

In some embodiments, as shown in FIG. 8, a distance L between the second opening 207 and the groove 203 closest to the second opening 207 in the at least one groove located on the periphery of the second opening 207 is in a range from 100 μm to 2000 μm.

The groove 203 is arranged within the above distance range, which may balance the pulling forces borne by both sides of the isolation stripes 200 in the thickness direction to the greatest extent, thereby ensuring that the side face where the recessed portion 202 on the isolation stripes 200 is located is not easily deformed, and ensuring a good film layer deposition effect obtained using the mask sheet 20.

On this basis, as shown in FIG. 10, some embodiments of the present disclosure provide a method of manufacturing a mask sheet 20. The method includes following steps.

Figure 11A:
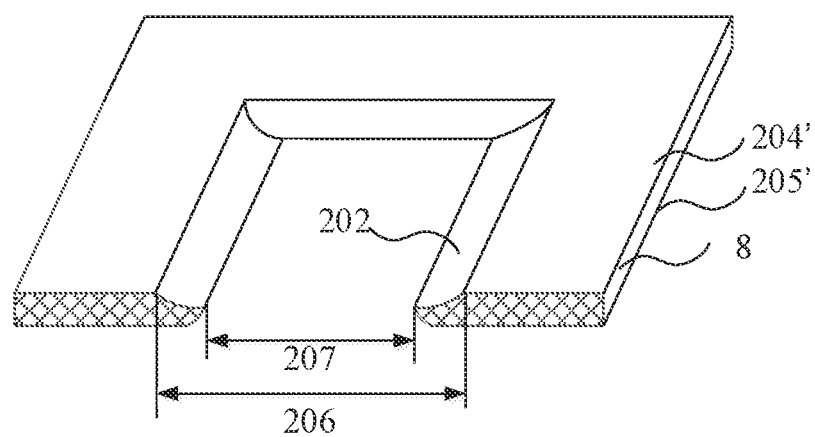
FIGS. 11A and 11B are schematic diagrams of a process of manufacturing a recessed portion, in accordance with some embodiments of the present disclosure.

In S10, as shown in FIG. 11A, at least one opening portion 201 is formed by etching from a first side face 204' of a mask sheet substrate 8 in a thickness direction of the mask sheet substrate 8.

Each opening portion 201 includes a first opening 206 extending from the first side face 204' toward a second side face 205' of the mask sheet substrate 8 and a second opening 207 extending from the second side face 205' toward the first side face 204', and the first opening 206 and the second opening 207 are communicated with each other. An orthographic projection of the second opening 207 on a surface parallel to the first side face 204' is located within an orthographic projection of the first opening 206 on the surface. The first side face 204' and the second side face 205' are substantially parallel to each other and arranged oppositely, and the first side face 204' is perpendicular to the thickness direction of the mask sheet substrate.

In some embodiments, a wet etching technique may be used to form the at least one opening portion 201.

It will be understood by those skilled in the art that the wet etching technique generally includes steps of coating a photoresist, exposing, developing and etching.

Figure 11B:
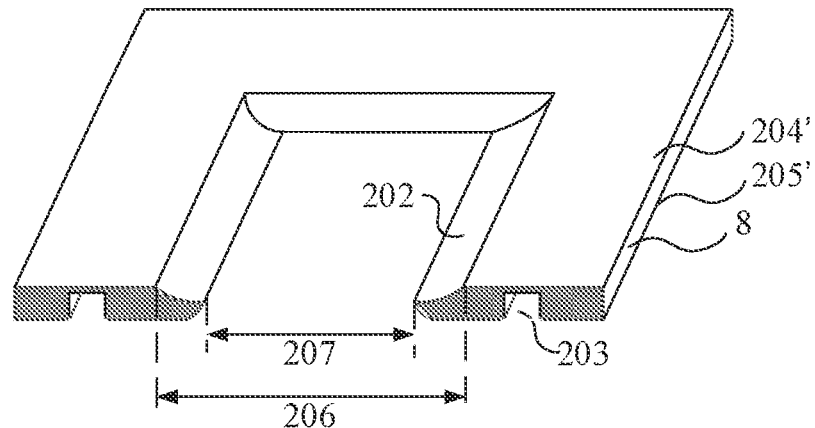

In S11, as shown in FIG. 11B, at least one groove 203 is formed in a periphery of the second opening 207 in the second side face 205' of the mask sheet substrate 8. The at least one groove 203 is formed in the second side face 205' of the mask sheet substrate 8 and is recessed towards the first side face 204' of the mask sheet substrate 8. An etching time of the wet etching technique is a half of a complete etching time.

The first side face and the second side face are parallel to each other and arranged oppositely, and are perpendicular to the thickness direction of the mask sheet substrate 8.

It will be noted that an execution sequence of the above S10 and S11 is not limited in the embodiments of the present disclosure. That is, S10 may be executed first, and then S11 is executed, or S11 may be executed first, and then S10 is executed.

The method of manufacturing the mask sheet 20 has the same beneficial effects as the above mask sheet 20, which will not be repeated herein.

Figure 12:
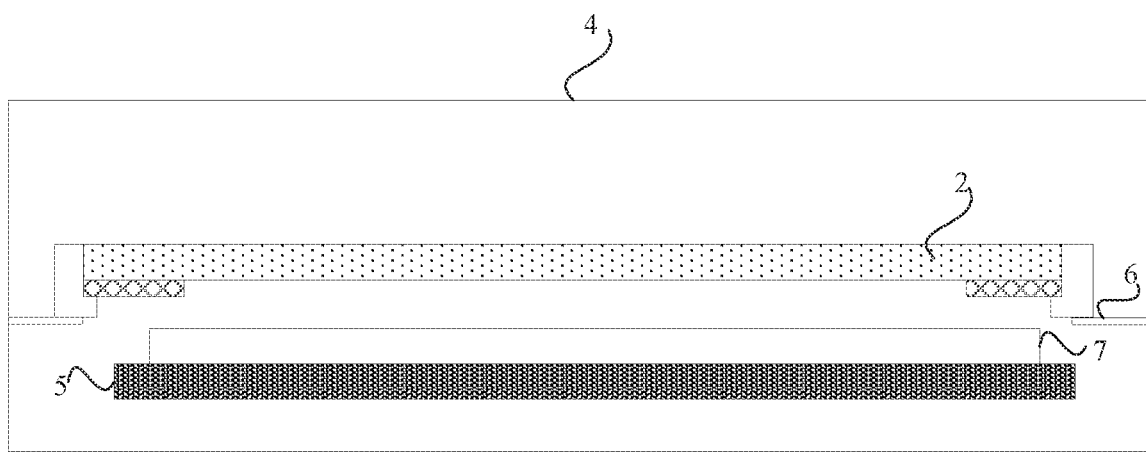
FIG. 12 is a cross-sectional structural diagram of a thin film deposition device, in accordance with some embodiments of the present disclosure.

On this basis, as shown in FIG. 12, some embodiments of the present disclosure further provide a thin film deposition device. The thin film deposition device includes a chamber 4, and a carrier 5, a mask fixing component 6, and an opening mask 2 that are provided in the chamber 4.

The carrier 5 is configured to carry a substrate 7 to be subject to thin film deposition. The mask fixing component 6 is configured to fix the opening mask 2.

The opening mask 2 is the above opening mask 2.

The substrate 7 may be the base 12, or a base 12 on which some film layers have been formed. For example, the substrate 7 includes the base 12 and the light-emitting devices 10 formed on the base 12.

When the thin film deposition device and the opening mask 2 are used for depositing a film layer, since the isolation stripes 200 in the opening mask 2 are warped upwards or bent downwards to a small extent, an alignment accuracy between the opening portion 201 of the mask sheet 20 and a film forming area on the substrate 7 is high, a shadow of the deposited film layer is narrow, and the film layer deposition effect obtained using the opening mask 2 is good.

Some embodiments of the present disclosure further provide a method of using an opening mask 2. The method includes: placing the above opening mask on a side of the substrate 7; and depositing a thin film material onto the substrate 7 from the side of the substrate 7 provided with the opening mask 2, the material deposited onto the substrate 7 through an opening portion 201 of the opening mask 2 forming a corresponding thin film.

The above thin film may be a first inorganic layer 111 or a second inorganic layer 112, or may be any other thin film that can be prepared through the opening mask 2.

The method of using the opening mask 2 has the same beneficial effects as the mask sheet 20, which will not be repeated herein.

Some embodiments of the present disclosure further provide a display apparatus, and the display apparatus includes a base and a thin film provided on the base. The thin film is formed through the method of using the opening mask.

The above descriptions are merely specific implementation manners of the present invention, but the protection scope of the present invention is not limited thereto. Changes or replacements that any person skilled in the art could readily conceive of within the technical scope of the present invention shall be included in the protection scope of the present invention. Therefore, the protection scope of the present invention shall be subject to the protection scope of the claims.

What is claimed is:

1. A mask sheet having a first side face and a second side face that are substantially parallel to each other and arranged oppositely, the first side face being perpendicular to a thickness direction of the mask sheet; the mask sheet comprising:
   at least one opening portion, each opening portion including a first opening extending from the first side face toward the second side face and a second opening extending from the second side face toward the first side face, and the first opening and the second opening being communicated with each other, and an inner border of the second opening being located within an outer border of the first opening in a direction perpendicular to a circumferential direction of the second opening; and
   at least one groove located on a periphery of the second opening, the at least one groove being formed in the second side face of the mask sheet, and an orthographic projection of the at least one groove on the first side face being partially overlapped with an orthographic projection of the first opening on the first side face, wherein each groove is arranged continuously around the second opening to form a completely closed ring.

2. The mask sheet according to claim 1, wherein the at least one opening portion includes a plurality of opening portions distributed at intervals.

3. The mask sheet according to claim 1, wherein the at least one groove includes a plurality of grooves nested in a direction from a center of the second opening to a circumference of the second opening; and
   any two adjacent grooves of the plurality of grooves are distributed at an interval or closely next to each other.

4. The mask sheet according to claim 3, wherein a depth of each groove is less than or equal to a half of a thickness of the mask sheet.

5. The mask sheet according to claim 1, wherein the at least one groove includes a plurality of grooves, and an orthographic projection of a groove of the plurality of grooves closest to the second opening on the first side face is partially overlapped with the orthographic projection of the first opening on the first side face.

6. The mask sheet according to claim 1, wherein a longitudinal sectional shape of each groove in a width direction of the groove is at least one of an arch, a semicircle, a semiellipse, a polygon and a regular shape, and the regular shape is a shape formed by combining at least two of the arch, the semicircle, the semiellipse and the polygon.

7. The mask sheet according to claim 1, wherein the at least one opening portion includes a plurality of opening portions, and minimum distances between each of the grooves and each of the second openings obtained by the plurality of opening portions are different.

8. The mask sheet according to claim 1, wherein a minimum distance between the at least one groove and the second opening is in a range from 100 μm to 2000 μm.

9. An opening mask, comprising a frame and the mask sheet according to claim 1 that is fixed on the frame.

10. The opening mask according to claim 9, wherein the frame and the mask sheet are made of same material.

11. A thin film deposition device, comprising:
a chamber, and
a carrier, a mask fixing component, and an opening mask provided in the chamber, the carrier configured to carry a substrate to be subject to thin film deposition;
the mask fixing component configured to fix the opening mask; and the opening mask being the opening mask according to claim 9.

12. A method of manufacturing a mask sheet, the method comprising:
forming at least one opening portion by etching from a first side face of a mask sheet substrate in a thickness direction of the mask sheet substrate, each opening portion including a first opening extending from the first side face toward a second side face of the mask sheet substrate and a second opening extending from the second side face toward the first side face, and the first opening and the second opening being communicated with each other, and an inner border of the second opening being located within an outer border of the first opening in a direction perpendicular to a circumferential direction of the second opening;
the first side face and the second side face being substantially parallel to each other and arranged oppositely, and the first side face being perpendicular to the thickness direction of the mask sheet substrate; and
forming at least one groove on a periphery of the second opening in the second side face of the mask sheet substrate, an orthographic projection of the at least one groove on the first side face being partially overlapped with an orthographic projection of the first opening on the first side face, each groove being arranged continuously around the second opening to form a completely closed ring.

13. A method of using the opening mask according to claim 9, the method comprising:
placing the opening mask on a side of a substrate; and
depositing a thin film material onto the substrate from the side of the substrate provided with the opening mask, the thin film material deposited onto the substrate through an opening portion of the opening mask forming a corresponding thin film.

14. A display apparatus, comprising a base and a thin film disposed on the base, the thin film being formed through the method of using the opening mask according to claim 13.

15. A method of using the opening mask according to claim 10, the method comprising:
placing the opening mask on a side of a substrate; and
depositing a thin film material onto the substrate from the side of the substrate provided with the opening mask, the thin film material deposited onto the substrate through an opening portion of the opening mask forming a corresponding thin film.

* * * * *